US008224488B2

(12) United States Patent
Collins et al.

(10) Patent No.: US 8,224,488 B2
(45) Date of Patent: Jul. 17, 2012

(54) SYSTEM AND METHOD FOR TEMPERATURE MANAGEMENT OF A DATA CENTER

(75) Inventors: Mark Collins, Dripping Springs, TX (US); John C. Pflueger, III, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 753 days.

(21) Appl. No.: 12/354,101

(22) Filed: Jan. 15, 2009

(65) Prior Publication Data

US 2010/0179695 A1 Jul. 15, 2010

(51) Int. Cl.
*G05B 13/00* (2006.01)
*G05D 23/00* (2006.01)

(52) U.S. Cl. .................. 700/276; 700/295

(58) Field of Classification Search .......... 700/275–278, 700/286, 291, 295–300; 705/412; 706/903, 706/907, 908
See application file for complete search history.

(56) References Cited

U.S. PATENT DOCUMENTS

| | | | |
|---|---|---|---|
| 6,374,627 B1 | 4/2002 | Schumacher et al. | |
| 6,772,604 B2 | 8/2004 | Bash et al. | |
| 6,775,997 B2 | 8/2004 | Bash et al. | |
| 6,832,489 B2 | 12/2004 | Bash et al. | |
| 6,832,490 B2 | 12/2004 | Bash et al. | |
| 6,834,512 B2 | 12/2004 | Bash et al. | |
| 6,854,284 B2 | 2/2005 | Bash et al. | |
| 6,859,366 B2 | 2/2005 | Fink | |
| 6,868,683 B2 | 3/2005 | Bash et al. | |
| 6,945,058 B2 | 9/2005 | Bash et al. | |
| 6,980,433 B2 | 12/2005 | Fink | |
| 7,046,514 B2 | 5/2006 | Fink et al. | |
| 7,114,555 B2 | 10/2006 | Patel et al. | |
| 7,145,772 B2 | 12/2006 | Fink | |
| 7,426,453 B2 * | 9/2008 | Patel et al. | 702/185 |
| 7,477,514 B2 * | 1/2009 | Campbell et al. | 361/699 |
| 7,506,264 B2 * | 3/2009 | Polan | 715/757 |
| 7,549,070 B2 * | 6/2009 | Zwinger et al. | 713/320 |
| 7,620,613 B1 * | 11/2009 | Moore et al. | 706/62 |
| 7,630,795 B2 * | 12/2009 | Campbell et al. | 700/300 |
| 7,642,914 B2 * | 1/2010 | Campbell et al. | 340/572.1 |
| 7,676,280 B1 * | 3/2010 | Bash et al. | 700/17 |
| 7,707,880 B2 * | 5/2010 | Campbell et al. | 73/202.5 |
| 7,726,144 B2 * | 6/2010 | Larson et al. | 62/259.2 |

(Continued)

OTHER PUBLICATIONS

Pflueger et al., Data Center Efficiency in the Scalable Enterprise, Dell Power Solutions, Feb. 2007, pp. 8-14, available at http://www.dell.com/downloads/global/power/ps1q07-20070210-CoverStory.pdf.

*Primary Examiner* — M. N. Von Buhr
(74) *Attorney, Agent, or Firm* — Baker Botts L.L.P.

(57) ABSTRACT

A system and method for managing the temperature of a data center is disclosed in which a target computer system is identified. The target computer system is the system that requires access or service. The operation of the computer systems in the vicinity of the target computer system is modified to reduce the temperature in the vicinity of the target computer system or along the pathway between the entrance to the data center and the target computer system. After the target computer system is accessed or serviced, the computer systems in the vicinity of the target computer system or along the pathway between the entrance to the data center and the target computer system can be returned to their original state.

20 Claims, 4 Drawing Sheets

U.S. PATENT DOCUMENTS

| | | | |
|---|---|---|---|
| 7,854,652 B2 * | 12/2010 | Yates et al. | 454/184 |
| 7,885,795 B2 * | 2/2011 | Rasmussen et al. | 703/5 |
| 7,894,945 B2 * | 2/2011 | Hillis | 700/276 |
| 7,991,592 B2 * | 8/2011 | VanGilder et al. | 703/1 |
| 2005/0023363 A1 * | 2/2005 | Sharma et al. | 236/49.3 |
| 2005/0159099 A1 * | 7/2005 | Malone | 454/186 |
| 2005/0246436 A1 * | 11/2005 | Day et al. | 709/223 |
| 2005/0283348 A1 * | 12/2005 | Tsui et al. | 703/13 |
| 2006/0161307 A1 * | 7/2006 | Patel et al. | 700/277 |
| 2007/0097636 A1 * | 5/2007 | Johnson et al. | 361/695 |
| 2007/0260417 A1 * | 11/2007 | Starmer et al. | 702/136 |
| 2008/0064317 A1 * | 3/2008 | Yates et al. | 454/118 |
| 2008/0288193 A1 * | 11/2008 | Claassen et al. | 702/61 |
| 2009/0113323 A1 * | 4/2009 | Zhao et al. | 715/764 |
| 2009/0138313 A1 * | 5/2009 | Morgan et al. | 705/8 |
| 2009/0259345 A1 * | 10/2009 | Kato et al. | 700/295 |
| 2009/0276528 A1 * | 11/2009 | Pienta et al. | 709/226 |
| 2009/0326879 A1 * | 12/2009 | Hamann et al. | 703/2 |
| 2010/0010678 A1 * | 1/2010 | Dawson et al. | 700/276 |
| 2010/0057259 A1 * | 3/2010 | Dawson et al. | 700/278 |
| 2010/0082178 A1 * | 4/2010 | Dawson et al. | 700/300 |
| 2010/0082309 A1 * | 4/2010 | Dawson et al. | 703/6 |

* cited by examiner

SYSTEM AND METHOD FOR TEMPERATURE MANAGEMENT OF A DATA CENTER

TECHNICAL FIELD

The present disclosure relates generally to computer systems and information handling systems, and, more particularly, to a system and method for the temperature management of a data center.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

A group of information handling systems may be included within a data center. A data center will typically include multiple computers systems, which may be arranged in racks. The racks are typically arranged in rows. The power consumed by each computer system is a significant factor in the total amount of power consumed by the data center as a whole. As computer systems have become more powerful, the computer systems have tended to generate more heat, thereby requiring larger fans for generating airflow within the interior of the computer systems for the purpose of cooling the computer systems. Minimizing power consumption requires operating the fans of the computer systems at the lowest speed that nevertheless results in the computer systems operating within their thermal limits. Running a large group of computer systems at the outer range of their thermal limits generates an excessive amount of heat in the interior of the data center, making it difficult for operators or maintenance centers works to work comfortably in the data center.

SUMMARY

In accordance with the present disclosure, a system and method for managing the temperature of a data center is disclosed in which a target computer system is identified. The target computer system is the system that requires access or service. The operation of the computer systems in the vicinity of the target computer system is modified to reduce the temperature in the vicinity of the target computer system or along the pathway between the entrance to the data center and the target computer system. After the target computer system is accessed or serviced, the computer systems in the vicinity of the target computer system or along the pathway between the entrance to the data center and the target computer system can be returned to their original state.

The system and method disclosed herein is technically advantageous because the system and method allows the servers of the data center to be operated in a mode that involves a moderate level of heat output, while reducing the energy costs of the data center. When a server in the data center needs to be serviced, the fan speed of the servers in a maintenance path is increased, thereby temporarily decreasing the temperature in the maintenance path so that the affected server can be serviced by a technician. The system and method thereby achieves a dynamic balance between controlling energy consumption and creating an temporary and acceptable work environment. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1:
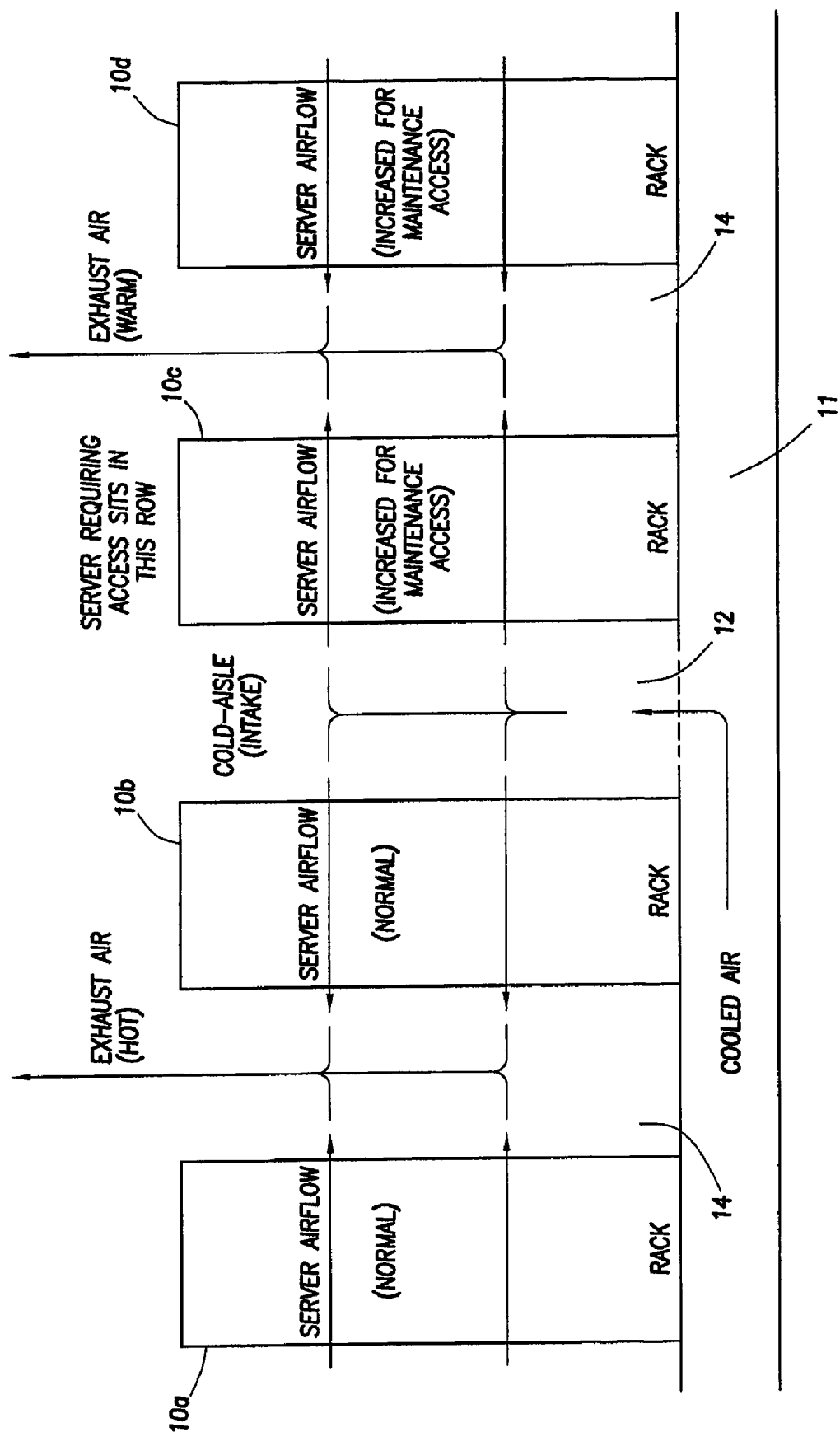
FIG. 1 is a side view of the racks of a data center.

A plurality of information handling systems may be housed in a data center. Shown in FIG. 1 is a side view of the racks 10 of a data center. Each rack typically includes several computer systems or servers. The computer systems or servers may comprise communications servers, such as web servers. The computer systems may also include storage servers, which provide an interface between a client and storage. The computer systems may also comprise computational units, which provide a computational power that may be distributed across several computer systems. As indicated in FIG. 1, the racks 10 may be arranged so that racks are placed in a back-to-back configuration to promote the use of cool aisles 12 and hot aisles 14. In the example of FIG. 1, cooled air is distributed to the racks through an air inlet 11. The cooler air in air inlet is passed into a cool aisle 12. From the cool aisle 12, the air enters the racks 10 and exits racks 10 into a hot aisle 14. Air passes through hot aisle 14 in an upward direction and away from racks 10. In the example of FIG. 1, the aisle between racks 10a and 10b is a hot aisle, and the aisle between racks 10c and 10d is a hot aisle. The aisle between racks 10b and 10c is a cool aisle. In operation, if it is determined that a computer system of rack 10c need servicing, the fans of the computer systems of rack 10c would be increased in speed, thereby reducing the temperature in the vicinity of rack 10c, including the temperature in the hot aisle 14 between rack 10c and rack 10d.

Figure 2:
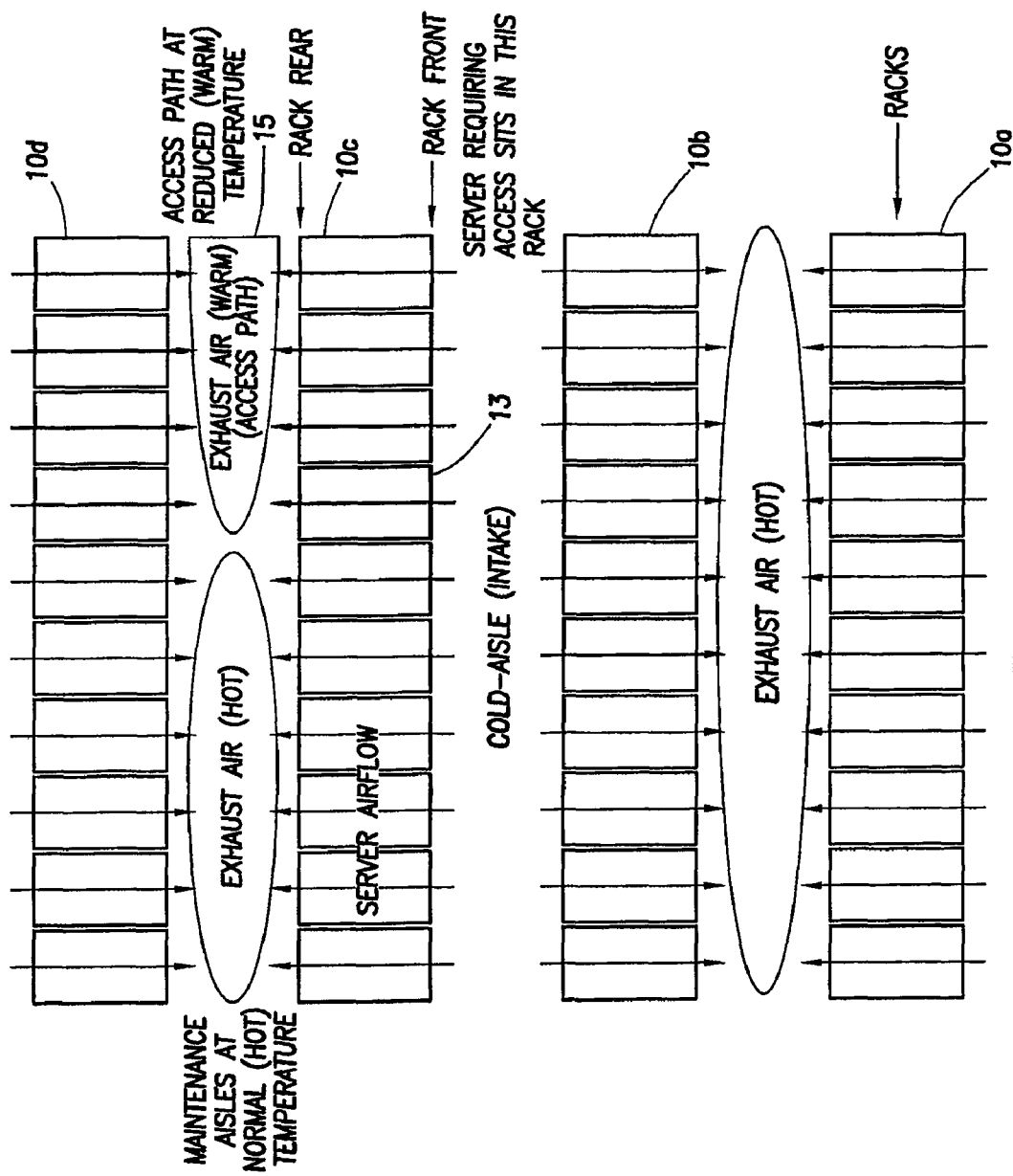
FIG. 2 is top view of the racks of a data center.

Shown in FIG. 2 is a top view of the data center of FIG. 1, including racks 10. A hot aisle 14 is formed between racks 10a and 10b, and a second hot aisle 14 is formed between racks 10c and 10d. A cool aisle is formed between racks 10b and 10c. In the data center, the computer system that needs to be serviced is identified at 13. Before a human operator enters the data center to service computer system 13, the fans of the computer systems the vicinity of computer system 13 are increased in speed, causing the temperature in the area in the vicinity of computer system to decrease. Shown in FIG. 2 is a bubble of cooler air 15 in the hot aisle between rack 10c and 10d. This bubble of cooler air is formed by increasing the speed of the fans in racks 10c and 10d nearest computer system 13. Because of the existence of the bubble of cooler air, a human operator can work in the vicinity of computer system 13. When the work of the human operator on computer system 10 is complete, the speed of the fans in the vicinity of computer system 10 can be decreased.

Figure 3:
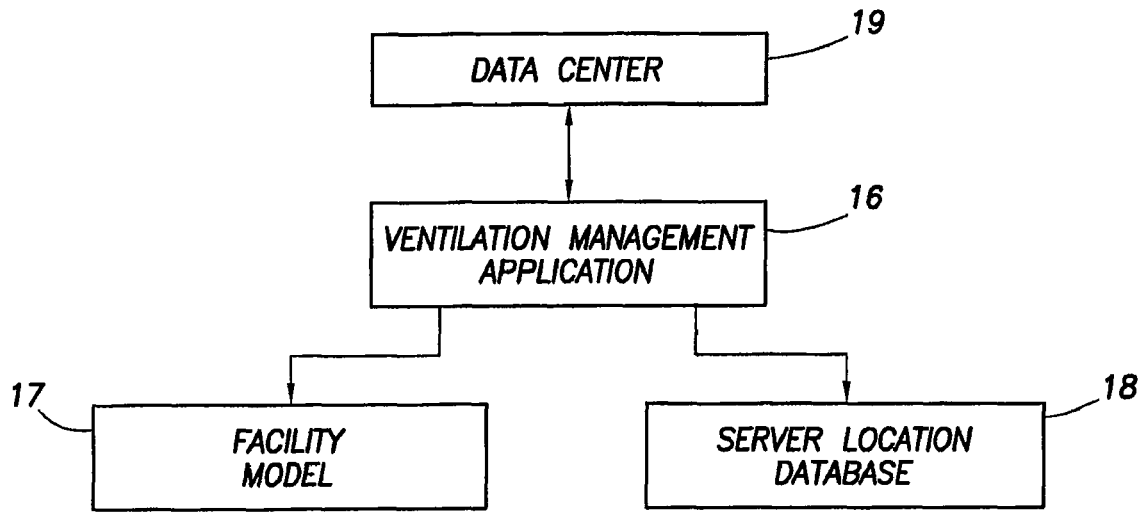
FIG. 3 is a block diagram of the data architecture of a temperature management system.

Shown in FIG. 3 is a block diagram of the data architecture of the temperature management system described herein. The architecture of the system includes a ventilation management application 16, which receives data from a facility model 17 and a database 18 of server locations. Ventilation management application 16 communicates with data center 19. When data center 19 identifies that a server in the data center needs to be serviced, the ventilation management application identifies the location of the server through server location database 18. The server location database identifies the unique location of the server. The location of the server may be uniquely identified through a set of GPS coordinates or by identifying the location of the server within a particular data center. Once the location of the server has been identified, the validation management application reads the facility model 17 to identify the servers whose fan speeds should be increased to accommodate a human operator in the vicinity of the server that must serviced. The identification of servers whose fan speeds must be increased includes not only the servers in the vicinity of the affected server, but also those servers that lie in the walkway between the door of the data center and the affected server. Thus, to accommodate a human operator in the data center, it may be necessary to reduce the temperature in the vicinity of the affected server as well as the temperature of the path that the human operator must take to reach the affected server. With respect to the path of the human operator through the data center, it is anticipated that the validation management application can also trigger lights or other indicators that would signal to the human operator the best and coolest path to take to reach the affected server.

Figure 4:
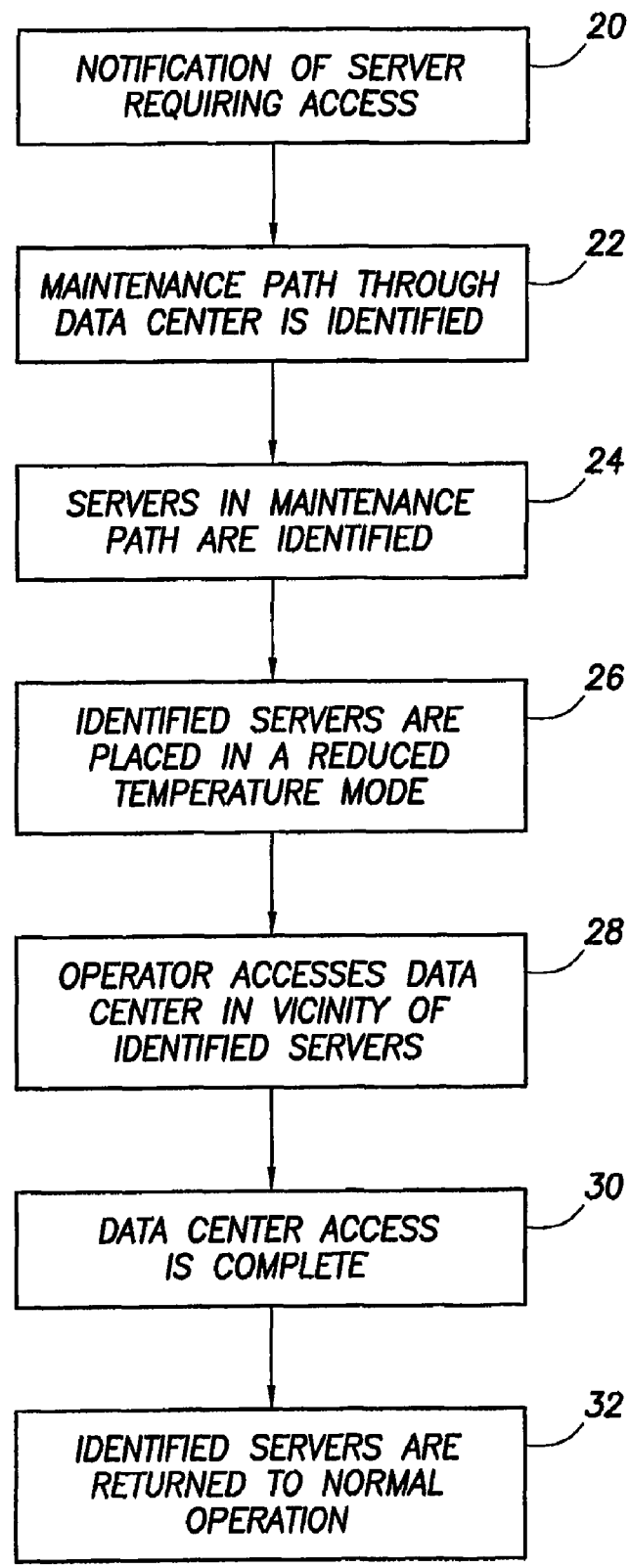
FIG. 4 is a flow diagram of a series of method steps for identifying and placing a set of servers in reduced temperature mode to facilitate the servicing of one or more servers in a data center.

FIG. 4 is a flow diagram of a series of method steps for identifying and placing a set of servers in reduced temperature mode to facilitate the servicing of one or more servers in a data center. At step 20, ventilation management application 16 receives a notification that a server or servers in the data centers require access. The servers requiring access are referred to as target servers The notification to the ventilation management application may be automatically generated by the target servers and transmitted to the ventilation management application. The notice will identify the target server or servers and the fault that occurred in the servers. Alternatively, an operator may manually notify the ventilation management application of the identity of the target servers. At step 22, the ventilation management application identifies a path through the data center to reach the target servers. As described with reference to FIG. 3, the ventilation management application determines the maintenance path by accessing the server location database 18 and the data center facility model 17. At step 24, the ventilation management application accesses the server location database and the data center facility model to identify the servers adjacent to and along the maintenance path. The target servers and the servers adjacent to and along the maintenance path are referenced to herein as the identified servers. The identified servers are placed in a reduced temperature mode at step 26. The identified servers are placed in a reduced temperature mode by increasing the fan speed of the fans in the identified servers. The fan speed may be increased through an integrated data center management application that is able to access and manage the fan speed of servers of the data center. At step 28 of FIG. 4, the operator accesses the data center by traversing the maintenance path. When the operator reaches the target server or target servers, the operator makes the necessary repairs to the target server. When the data center access is complete at step 30, the speed of the fans of the identified servers are returned to normal operation at step 32 by reducing the speed of the fans.

Figure 5:
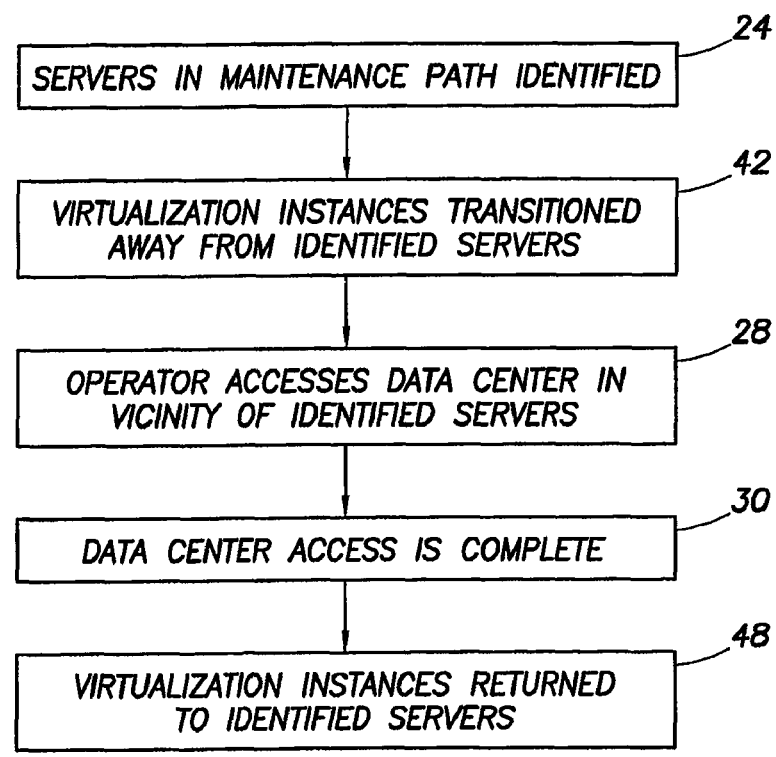
FIG. 5 is a flow diagram of a series of method steps for managing the transition of virtual machines in a data center to manage the temperature of a data center and control access to the data center.

Shown in FIG. 5 is a flow diagram that concerns the management of virtualization machine in a data center to manage the temperature of a data center and control access to the data center. At step 24, the servers in the maintenance path are identified. The step of identifying the servers in the maintenance path is performed according to the steps outlined in steps 20, 22, and 24 of FIG. 4. Each server may include multiple virtual machines. A virtual machine is a software construct that simulates an instance of an operating system and associated firmware. Once the identified servers in the maintenance path are identified, the virtual machines on the identified servers are transitioned away from the identified servers so that the virtual machines execute on servers that are not in the maintenance path of the target server or servers. The transition of the virtual machines away from the identified servers, reduces the computational load of the identified servers. Because the computational load on these servers is reduced, the heat generated by the servers is likewise reduced. At step 28, an operator access the target servers data center by traversing the maintenance path. Following the completion of the data center access at step 30, the virtual machines are returned to the identified servers at step 48. After the virtual machines are returned to their identified servers, the identified servers are returned to their normal operation and heat generation.

The system and method described herein is advantageous in that it allows the servers of the data center to be operated in a mode that involves a moderate level of heat output, while reducing the energy costs of the data center. When a server in the data center needs to be serviced, the fan speed of the servers in a maintenance path is increased, thereby temporarily decreasing the temperature in the maintenance path so that the affected server can be serviced. Although the system and method has been described herein with reference to servers, it should be understood that the system and method described herein can be employed with regard to any computing system. Although the present disclosure has been described in detail, it should be understood that various changes, substitutions, and alterations can be made hereto without departing from the spirit and the scope of the invention as defined by the appended claims.

What is claimed is:

1. A system for managing the temperature of a data center, wherein the data center includes multiple computer systems, comprising:
a ventilation management system, wherein the ventilation management system is operable to:
access data that identifies a location of a target computer system in the data center;
access data that identifies a layout of the multiple computer systems included in the data center;
generate a record that identifies a pathway through the data center to the target computer system; and
initiate a reduced temperature mode in at least one of the multiple computer systems adjacent to the pathway.

2. The system for managing the temperature of a data center of claim 1, wherein the reduced temperature mode includes an increase in a speed of a fan of the at least one of the multiple computer systems adjacent to the pathway, wherein increasing the speed of the fan decreases a temperature within the pathway.

3. The system for managing the temperature of a data center of claim 2, wherein the ventilation management system is further operable to reduce the speed of the fan, wherein reducing the speed of the fan increases the temperature within the pathway.

4. The system for managing the temperature of a data center of claim 1, wherein the reduced temperature mode includes a transition of at least one instance of a virtual machine away from the at least one of the multiple computer systems adjacent to the pathway, wherein the transition of the at least one instance of the virtual machine decreases a temperature within the pathway.

5. The system for managing the temperature of a data center of claim 4, wherein the ventilation management system is further operable to transition at least one instance of the virtual machine to the at least one of the multiple computer systems adjacent to the pathway in order to increase the temperature within the pathway.

6. The system for managing the temperature of a data center of claim 1, wherein the pathway through the data center comprises a path for a human operator to traverse in order to reach the target computer system in the data center.

7. The system for managing the temperature of a data center of claim 1, wherein the multiple computer systems of the data center are server systems.

8. A method for managing the temperature of a data center, comprising:
identifying a target computer system in the data center that requires access by a human operator;
modifying the operation of at least one computer system adjacent to the target computer system from a first state of operation to a reduced temperature mode, wherein the reduced temperature mode causes a reduction in a temperature of an area of the data center adjacent to the target computer system.

9. The method for managing the temperature of a data center of claim 8, wherein the step of identifying a target computer system in the data center that requires access comprises the step of receiving an automated notice from the target computer system.

10. The method for managing the temperature of a data center of claim 8, wherein the step of identifying a target computer system in the data center that requires access comprises the step of receiving a manual identification of the target computer system.

11. The method for managing the temperature of a data center of claim 8, wherein the step of modifying the operation of the at least one computer system comprises the step of increasing a fan speed of a fan of the at least one computer system.

12. The method for managing the temperature of a data center of claim 8, wherein the step of modifying the operation of the at least one computer system comprises the step of transitioning a virtual machine away from the at least one computer system.

13. The method for managing the temperature of a data center of claim 8, further comprising the step of servicing the target computer system.

14. The method for managing the temperature of a data center of claim 13, further comprising the step of returning the at least one computer system to the first state of operation.

15. The method for managing the temperature of a data center of claim 8, wherein the step of modifying the operation of the at least one computer system comprises accessing a database to identify the at least one computer system in a floor layout of the data center.

16. The method for managing the temperature of a data center of claim 8, further comprising generating a maintenance path from the entrance to the data center to the target computer system.

17. A method for adjusting the temperature of a data center, comprising:
identifying a target computer system;
identifying at least one server adjacent to a pathway between an entrance to the data center and the target computer system;
adjusting the operation of the at least one server, wherein adjusting the operation causes a reduction in a temperature of the pathway.

18. The method for adjusting the temperature of a data center of claim 17, wherein the step of adjusting the operation of the at least one server comprises the step of reducing a speed of a fan of the at least one server.

19. The method for adjusting the temperature of a data center of claim 17, wherein the step of adjusting the operation of the at least one server comprises the step of transitioning a virtual machine away from the at least one server.

20. The method for adjusting the temperature of a data center of claim 17, wherein the target computer system is a server system.

* * * * *